(12) United States Patent
Hieda et al.

(10) Patent No.: US 6,303,277 B1
(45) Date of Patent: Oct. 16, 2001

(54) PATTERN FORMING METHOD AND METHOD OF MANUFACTURING DEVICE HAVING FINE PATTERN

(75) Inventors: Hiroyuki Hieda, Yokohama; Takashi Ishino, Kawasaki; Kuniyoshi Tanaka, Miura; Katsuyuki Naito, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/386,167

(22) Filed: Aug. 31, 1999

(30) Foreign Application Priority Data

Sep. 17, 1998 (JP) .................................................. 10-263502

(51) Int. Cl.$^7$ ........................................................ G03C 8/42
(52) U.S. Cl. ............................ 430/322; 430/312; 430/323
(58) Field of Search ................................... 430/312, 322, 430/323, 324

(56) References Cited

U.S. PATENT DOCUMENTS

| | | | |
|---|---|---|---|
| 4,174,217 | * 11/1979 | Flately ................................. | 96/36.2 |
| 4,597,826 | * 7/1986 | Majima et al. ....................... | 156/643 |
| 4,945,028 | * 7/1990 | Ogawa ................................. | 430/296 |
| 5,079,130 | * 1/1992 | Derkit, Jr. ............................ | 430/321 |
| 5,198,412 | * 3/1993 | Nagesh et al. ........................... | 606/1 |
| 5,324,623 | * 6/1994 | Tsumori ................................ | 430/321 |
| 5,376,483 | * 12/1994 | Rolfson ..................................... | 430/5 |
| 5,512,328 | * 4/1996 | Yoshimura et al. ................. | 427/498 |
| 5,766,808 | * 6/1998 | Linde et al. ............................ | 430/15 |
| 5,846,694 | * 12/1998 | Strand et al. ....................... | 430/321 |
| 5,858,620 | * 1/1999 | Ishibashi et al. ................... | 430/313 |
| 5,863,707 | * 1/1999 | Lin ...................................... | 430/313 |

* cited by examiner

*Primary Examiner*—Janet Baxter
*Assistant Examiner*—Yvette M. Clarke
(74) *Attorney, Agent, or Firm*—Oblon, Spivak, McClelland, Maier & Neustadt, P.C.

(57) ABSTRACT

The present invention provides a pattern forming method including the steps of forming a first thin film on an object to be etched, forming a first surface region and a second surface region on a surface of the object by modifying or removing a portion of the first thin film, the first and second surface regions differing from each other in the surface state, forming a second thin film on the first surface region by utilizing the difference in the surface state between the first and second surface regions, the second thin film being amorphous and thicker than the first thin film, and etching the object using the second thin film as an etching mask.

29 Claims, 3 Drawing Sheets

PATTERN FORMING METHOD AND METHOD OF MANUFACTURING DEVICE HAVING FINE PATTERN

BACKGROUND OF THE INVENTION

The present invention relates to a pattern forming method and a method of manufacturing a device having a fine pattern. The device having a fine pattern represents, for example, a semiconductor device or a recording medium that has a fine pattern and requires a microscopical processing technology for the manufacture thereof.

A lithography technology using photoresist, etc. is widely used nowadays in the technical field requiring a microscopical processing technology as in the manufacture of a semiconductor device. The lithography technology permits forming a relatively fine pattern.

However, the degree of integration of a semiconductor dievice such as DRAM is made higher and the density of a recording medium such as DVD is made higher in recent years. As a result, attentions are paid to the development of a microscopical processing technology of nanometers scale.

In the lithography technology, the resolution can be increased by forming, for example, a resist film very thin. To be more specific, where a resist film formed on a film to be etched is irradiated with light, the photoresist is sensitive to both the incident light emitted from a light source and a reflected light from the film to be etched. The reflected light from the underlying layer runs through an optical path differing from that of the incident light or is scattered within the resist film so as to give an adverse effect to the resolution. The adverse effect is rendered prominent with increase in the thickness of the resist film. Therefore, a high resolution can be achieved by forming the resist film very thin.

For improving the resolution by this method, it is considered most effective to use a monomolecular film, e.g., a Langmuir-Blodget film (hereinafter referred to as LB film), as a resist film. In fact, various researches are being made on the use of an ultra thin film such as a monomolecular film as a resist film.

For example, M. J. Lercel et al. report in "J. Vac. Sci. Technol. B11(6), 2823 (1993)" that a monomolecular film of n-octadecyl trichlorosilane formed on a surface of a $SiO_2$ substrate or a monomolecular film of n-octadecane thiol formed on a surface of a GaAs substrate was exposed to an electron beam to form a pattern of the monomolecular film. M. J. Lercel et al. also report that a grating having a width of 25 nm was formed by applying a wet etching to the substrate surface using the pattern thus obtained as a mask.

Also, the technology of exposing a monomolecular film to an ion beam is disclosed by P.C. Reike et al. in "Langmuir 10, 619 (1994)" and by G. Gillen et al. in "Appl. Phys. Lett. 65, 534 (1994)". K. K. Berggren et al. disclose the technology of exposing a monomolecular film to an atomic beam in "Science 269, (1995)". Further, the technology of exposing a monomolecular film to light using a probe of a scanning probe microscope is disclosed by L. Stockman et al. in "Appl. Phys. Lett. 62, 2935 (1993)", by S. Yamamoto et al. in "Jpn. J. Appl. Phys. 34, 3396 (1995)", by C. R. K. Marrian et al. in "Appl. Phys. Lett. 64, 390 (1994)" and by Y. -T. Kim et al. in "Langmuir 8, 1096 (1992)". It is also reported in each of these documents that a pattern of scores of nanometers scale was formed successfully.

However, it is reported by M. J. Lercel et al. in "J. Vac. Sci. Technol. B11 (6), 2823 (1993)" that an ultra thin film such as a monomolecular film has fine defects and, thus, fails to exhibit a sufficient resistance to etching for using the monomolecular film as an etching mask. Therefore, it was difficult to form a fine pattern with a high resolution by the methods exemplified above.

BRIEF SUMMARY OF THE INVENTION

An object of the present invention is to provide a pattern forming method that makes it possible to form a fine pattern with a high resolution.

Another object of the present invention is to provide a method of manufacturing a device that makes it possible to manufacture a device having a high density or a high degree of integration with a high accuracy.

According to an aspect of the present invention, there is provided a pattern forming method comprising the steps of forming a first thin film on an object to be etched, forming a first surface region and a second surface region on a surface of the object by modifying or removing a portion of the first thin film, the first and second surface regions differing from each other in the surface state, forming a second thin film on the first surface region by utilizing the difference in the surface state between the first and second surface regions, the second thin film being amorphous and thicker than the first thin film, and etching the object using the second thin film as an etching mask.

According to another aspect of the present invention, there is provided a method of manufacturing a device having a fine pattern, comprising the steps of forming a first thin film on an object to be etched, forming a first surface region and a second surface region on a surface of the object by modifying or removing a portion of the first thin film, the first and second surface regions differing from each other in the surface state, forming a second thin film on the first surface region by utilizing the difference in the surface state between the first and second surface regions, the second thin film being amorphous and thicker than the first thin film, and etching the object using the second thin film as an etching mask, the etched object forming a fine pattern and constituting at least a part of the device.

In the present invention, a first thin film is formed first on a surface of an object to be etched. The first thin film, which is not used as an etching mask, is for forming a first region and a second region differing from each other in the surface state on a surface of the object. Therefore, the first thin film need not be resistant to etching.

Also, the first thin film, which is not used as an etching mask, can be formed very thin like an ultra thin film, making it possible to suppress the adverse effect given by, for example, the reflected light to the resolution. As a result, the first and second regions can be formed with a high resolution.

In the present invention, a second thin film is selectively formed on the first region by utilizing the difference in the surface state between the first and second regions. It is necessary for the second thin film, which is used as an etching mask, to be resistant to etching and to be thicker than the first thin film.

The second thin film is patterned by utilizing the difference in the surface state between the first and second regions. In other words, a light irradiation is not utilized for patterning the second thin film. Also, the first and second regions are formed with a high resolution, as already described. It follows that the second thin film can also be formed with a high resolution.

In the present invention, the second thin film is amorphous. If the second thin film is crystalline, an undesired crystal growth or the like takes place, making it difficult to allow the shape of the second thin film to conform with the shape of the first region. In other words, it is difficult to form the second thin film in a desired pattern.

As described above, the second thin film used as an etching mask can be formed with a high resolution in the present invention. Also, the second thin film is resistant to etching and can be formed thick. It follows that an object can be patterned with a high resolution by etching the object using the second thin film as an etching mask. In other words, the present invention makes it possible to form a fine pattern with a high resolution.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
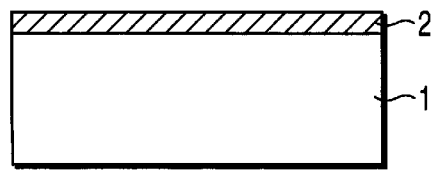
FIGS. 1A to 1E are cross sectional views collectively showing schematically a pattern forming method according to a first embodiment of the present invention.

The present invention will now be described in detail with reference to the accompanying drawings. Throughout the drawings, the same members are denoted by the same reference numerals for avoiding overlapping descriptions.

FIGS. 1A to 1E are cross sectional views collectively showing schematically a pattern forming method according to one embodiment of the present invention. According to the first embodiment, a fine pattern is formed as follows.

In the first step, an ultra thin film 2, which is a first thin film, is formed on a substrate 1, as shown in FIG. 1A. In this embodiment, a surface region of the substrate 1 constitutes an object to be etched. However, it is possible for a thin film formed on the substrate 1 to constitute the object.

The ultra thin film 2 is formed in general in a thickness of 100 nm or less, preferably 50 nm or less, and more preferably 10 nm or less. Since a high resolution can be obtained by forming the ultra thin film 2 as thin as possible, as already described, the ultra thin film 2 should ideally consist of a monomolecular film or a monoatomic film. In other words, the lower limit in the thickness of the ultra thin film 2 is equal to the thickness of a monomolecular film or a monoatomic film.

The ultra thin film 2 can be formed, for example, as follows. In the first step, an acid treatment is applied to the substrate 1 to make the surface of the substrate 1 hydrophilic, followed by dipping the substrate 1 in a liquid such as water. Then, an LB film, which is a monomolecular film, is formed at the interface between the liquid and the outer atmosphere. The LB film thus formed is transferred onto the surface of the substrate 1 by pulling the substrate 1 out of the liquid, thereby forming the ultra thin film 2 consisting of an LB film on the surface of the substrate 1.

Where an LB film is used for forming the ultra thin film 2, a plurality of LB films may be stacked one upon the other. For example, an LB film is formed at the interface between the liquid and the outer atmosphere by using molecules having both hydrophilic groups and hydrophobic groups. Then, the substrate 1 having the surface made hydrophobic by using, for example, hexamethyl disilazane, is dipped in the liquid for transferring the LB film onto the surface of the substrate 1. Since the surface of the substrate 1 is made hydrophobic in advance, the hydrophobic group of the molecule constituting the LB film acts on the surface of the substrate 1. As a result, the hydrophilic group of the particular molecule is exposed to the surface of the LB film. Then, the substrate 1 is pulled out of the liquid, thereby transferring a second LB film onto the substrate 1. It follows that the ultra thin film 2 consisting of two LB films stacked one upon the other is formed on the substrate 1.

Since the hydrophilic group is exposed to the surface of the first LB film, the hydrophobic group is exposed to the surface of the second LB film. Therefore, the ultra thin film 2 consisting of three or more LB films stacked one upon the other can be formed by repeating the operation described above. By stacking a plurality of LB films one upon the other, it is possible to obtain the ultra thin film 2 that is more stable and unlikely to be peeled off.

Where the substrate 1 is made of a metal such as Au, Ag or Cu or GaAs, or where a thin film of a metal such as Au, Ag or Cu or GaAs is formed on the substrate 1, the ultra thin film 2 can be formed by using, for example, an alkane thiol. For example, a solution is prepared first by dissolving an alkane thiol in a suitable solvent, followed by dipping the substrate 1 in the solution. Then, the substrate 1 is taken out of the solution, followed by washing the substrate 1 with a suitable solvent such as ethanol or n-hexane. The mercapto group of the alkane thiol is coupled with the metal such as Au, Ag, Cu or GaAs. It follows that a monomolecular film of the alkane thiol can be formed on the substrate 1 by the operation described above.

Where the ultra thin film 2 is formed of a monomolecular film, it is possible to use materials other than those described above. For example, the ultra thin film consisting of a monomolecular film can be formed by using a silane coupling agent such as chlorosilane, methoxy silane, ethoxy silane, and disilazane. Where a —OH group or the like is present on the surface of the substrate 1, the coupling agent undergoes a hydrolytic reaction to form a stable covalent bond. As a result, the ultra thin film 2 consisting of a monomolecular film is formed on the surface of the substrate 1.

Where the surface region of the substrate 1 is formed of silicon, a thin film consisting of hydrogen atoms terminating on the surface of the substrate 1 or a very thin oxide film such as a native oxide film can be used as the ultra thin film 2. The thin film consisting of hydrogen atoms can be formed by treating the substrate 1 from which organic substances have been removed with, for example, a dilute hydrofluoric acid. Also, the very thin oxide film can be formed by treating the substrate 1, which has been treated with the dilute hydrofluoric acid, with a concentrated sulfuric acid.

Figure 1B:
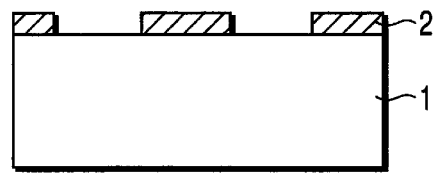

In the next step, the ultra thin film 2 formed on the substrate 1 is selectively removed, as shown in FIG. 1B, to form first and second regions differing from each other in the surface state on the surface of the substrate 1.

The first and second regions can be formed, for example, as follows. Specifically, the ultra thin film 2 is selectively irradiated with an energy beam such as an electron beam, an ultraviolet light, an X-ray, an ion beam or an atomic beam, which has been sufficiently converged, followed by applying a developing treatment such as washing with an alcohol to the ultra thin film 2 so as to selectively remove the ultra thin film 2. Where the ultra thin film 2 is formed by using, for example, an alkane thiol or a silane coupling agent, the non-irradiated portion of the ultra thin film 2 is strongly coupled with the substrate surface, making it possible to remove the irradiated portion using a solvent such as alcohol.

As already described, the ultra thin film 2 is not required to exhibit resistance to etching. Therefore, any material can be used for forming the ultra thin film 2 as far as a thin film can be formed and first and second regions differing from each other in the surface state can be formed on the surface of the substrate 1.

Figure 1C:
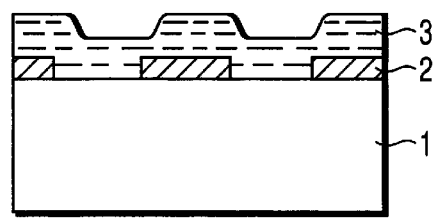

After patterning of the ultra thin film 2 by the method described above, a mask material 3 that is a material of an etching mask is supplied onto the substrate 1 to cover the patterned ultra thin film 2, as shown in FIG. 1C. The mask material 3 can be supplied by coating, for example, by spin coating the substrate 1 with a solution prepared by dissolving the mask material 3 in a solvent. Alternatively, the mask material 3 can be supplied onto the substrate 1 by means of vacuum deposition or the like.

Figure 1D:
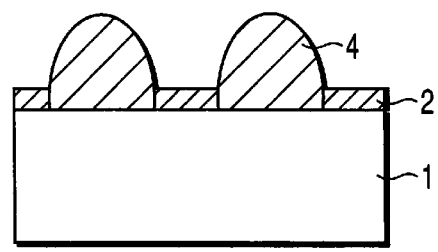

As already described, the exposed portion of the substrate 1 and the ultra thin film 2 differ from each other in the surface energy. Therefore, the mask material 3 supplied onto the ultra thin film 2 on the substrate 1 is migrated into a more stable region. Specifically, the mask material 3 is selectively agglomerated on the exposed portion of the substrate 1 or on the ultra thin film 2. It follows that, an etching mask 4, which is a second thin film, can be obtained as shown in FIG. 1D. Incidentally, FIG. 1D shows the state that the etching mask 4 is formed in the exposed portion of the substrate 1.

As described above, the difference in the surface state between the first and second regions is utilized for forming a pattern of the etching mask 4, and a light irradiation is not utilized for forming the patterned etching mask 4. The first and second regions are formed with a high resolution. Naturally, the pattern of the etching mask 4 is also formed with a high resolution. It should also be noted that an amorphous etching mask 4 can be obtained easily by selecting appropriately the mask material 3.

Where the etching mask 4 is amorphous, it is possible to allow the pattern of the etching mask 4 to conform with the pattern of the first region with a high accuracy. It follows that the method of the present invention permits forming the etching mask 4 in a desired pattern.

Where the etching mask 4 is amorphous, it is also possible to increase easily and sufficiently the thickness of the etching mask 4, making it possible to prevent without fail the etching mask 4 from disappearing during the etching treatment. Incidentally, the thickness of the etching mask 4, which is not particularly limited as far as the mask 4 is thicker than the ultra thin film 2 and exhibits a sufficient resistance to etching, should generally be at least 5 nm and preferably at least 10 nm. Also, the upper limit in the thickness of the etching mask 4, which is not particularly limited as far as the mask 4 can be formed with a high resolution, should generally be 500 nm or less, preferably 100 nm or less.

As described above, the etching mask 4 is formed by utilizing the difference in the surface state between the first and second regions in the method according to the first embodiment of the present invention. The principle of forming the etching film 4 will now be described in detail.

Specifically, the surface energy and the interfacial energy are important in considering the agglomerated state of a medium B on a surface A. It should be noted that equations given below can be obtained from the formula by Yang and Dupre:

$$W_{AB} = \gamma_B (1 + \cos \theta) \quad [1]$$

$$\gamma_A - \gamma_{AB} = \gamma_B \cos \theta \quad [2]$$

where $\gamma_A$ and $\gamma_B$ represent the surface energies of surface A and medium B, respectively, $\gamma_{AB}$ represents the interfacial energy at the interface between the surface A and the medium B, and $W_{AB}$ represents the adhesion energy between the surface A and the medium B.

Equation [1] indicates that the attractive force between the surface A and the medium B is increased with decrease in the contact angle $\theta$ of the medium B with the surface A (i.e., with increase in the value of $\cos \theta$). On the other hand, equation [2] indicates that the value of $\gamma_A - \gamma_{AB}$ is increased with decrease in the contact angle $\theta$. In other words, equation [2] indicates that the surface A covered with the medium B is more stable than the surface A exposed to the outside.

What should be noted is that, if the surface A consists of a surface region $A_1$ and another surface region $A_2$ differing from the surface region $A_1$ in the surface state, the contact angle $\theta$, the surface energy $\gamma_A$, etc. in the surface region $A_1$ can be made different from those in the surface region $A_2$. In other words, the stability of the medium B in the case where the medium B is present on the surface region $A_1$ can be made different from that in the case where the medium B is present on the surface region $A_2$. It follows that it is possible to allow the medium B to be agglomerated selectively on only one of the surface regions $A_1$ and $A_2$ by controlling appropriately the contact angle $\theta$, the surface energy $\gamma_A$, etc. in the surface region $A_1$ or $A_2$. The particular principle is utilized in the first embodiment as well as in second and third embodiments which are to be described herein later.

As described above, the self-assembly like agglomeration process is utilized for forming the pattern of the etching mask 4 and, thus, the mask material 3 does not require photosensitivity. In short, it suffices for the mask material 3 to exhibit resistance to the etching and to be selectively agglomerated on one of the exposed portion of the substrate 1 and the ultra thin film 2. This makes it possible to use in this embodiment of the present invention various materials that were unable to be used as an etching mask in the past. Incidentally, the etching rate of the mask material 3 should desirably be ½ or less of the etching rate of the object to be etched, i.e., the surface region of the substrate 1 in this embodiment. In this case, the etching mask 4 exhibits a sufficient resistance to etching.

Organic compounds of a low molecular weight represented by, for example, the formula given below can be used as the mask material 3. The etching mask 4 formed by using these organic compounds is amorphous:

$$Z-(X-Y)_n$$

where Z represents an aromatic skeleton or an alicyclic skeleton, Y represents an aromatic skeleton or a complex skeleton having a heavy atom, X represents a substituent for coupling Z and Y or Y and another Y, and n is an integer of 1 or more. If n is 3 or more, the glass transition temperature of the compound is not lower than room temperature, therefore a stable amorphous state can be realized.

The skeleton Z includes those represented by chemical formulas (Z1) to (Z58) given below. The substituent X includes those represented by chemical formulas (X1) to (X13) given below. Further, the skeleton Y includes those represented by chemical formulas (Y1) to (Y81) given below. In the aromatic skeleton or alicyclic skeleton represented by chemical formulas (Y1) to (Y81), the hydrogen atom may be replaced by any of —$CH_3$, —$Si(CH_3)_3$ and —$Sn(CH_3)_3$. Also, the compounds represented by chemical formulas (1) to (17) given below may be used as the mask material 3 that is particularly useful for forming the amorphous etching mask 4.

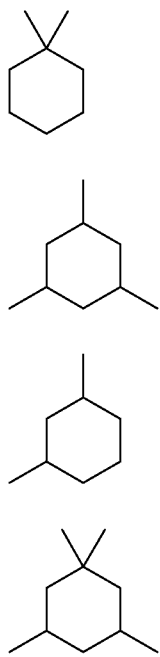

(Z-1)
(Z-2)
(Z-3)
(Z-4)
(Z-5)
(Z-6)

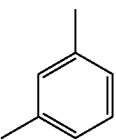
(Z-7)

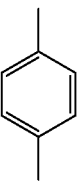
(Z-8)

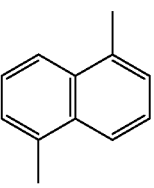
(Z-9)

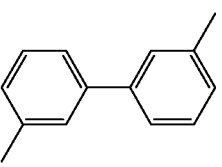
(Z-10)

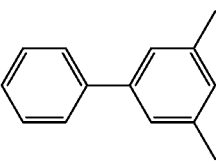
(Z-11)

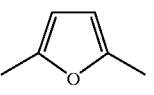
(Z-12)

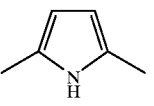
(Z-13)

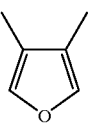
(Z-14)

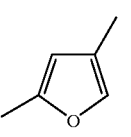
(Z-15)

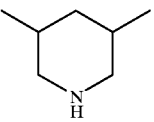
(Z-16)

(Z-17) 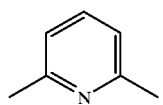
(Z-18) 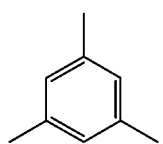
(Z-19) 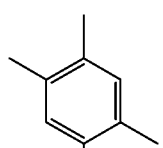
(Z-20) 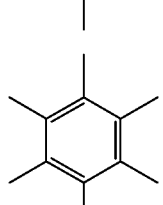
(Z-21) 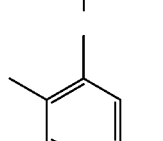
(Z-22) 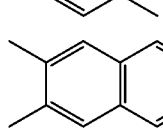
(Z-23) 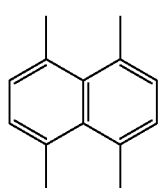
(Z-24) 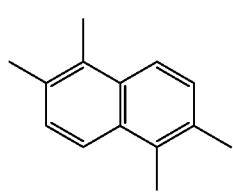
(Z-25) 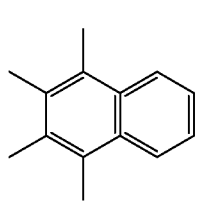
(Z-26) 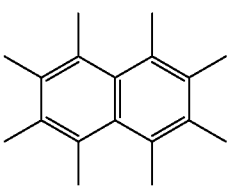
(Z-27) 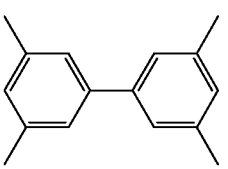
(Z-28) 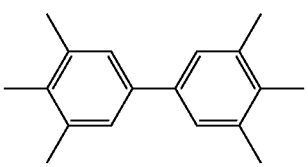
(Z-29) 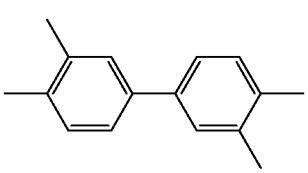
(Z-30) 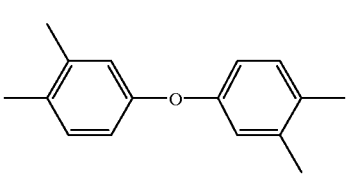
(Z-31) 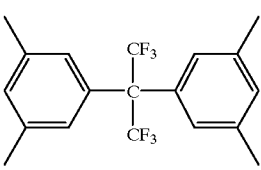
(Z-32) 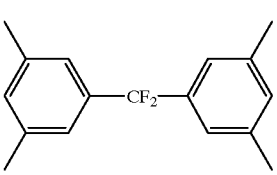

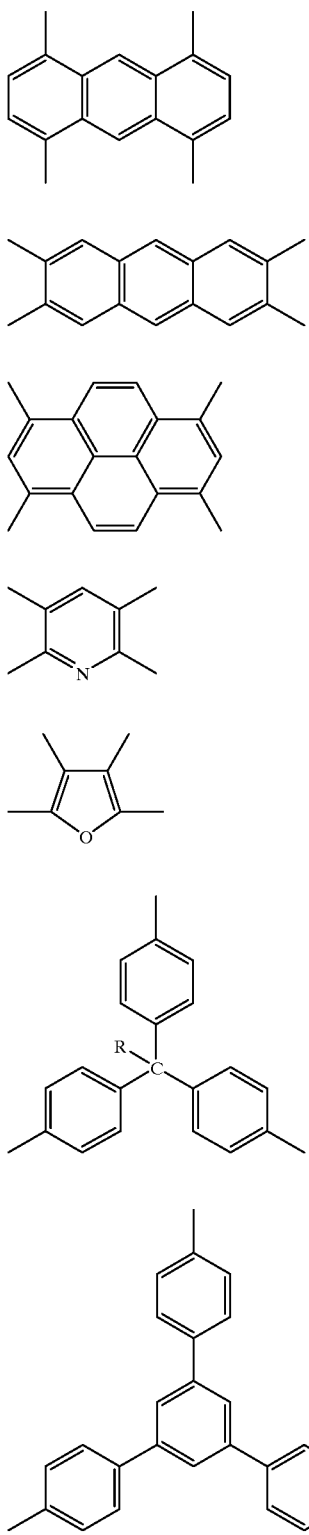
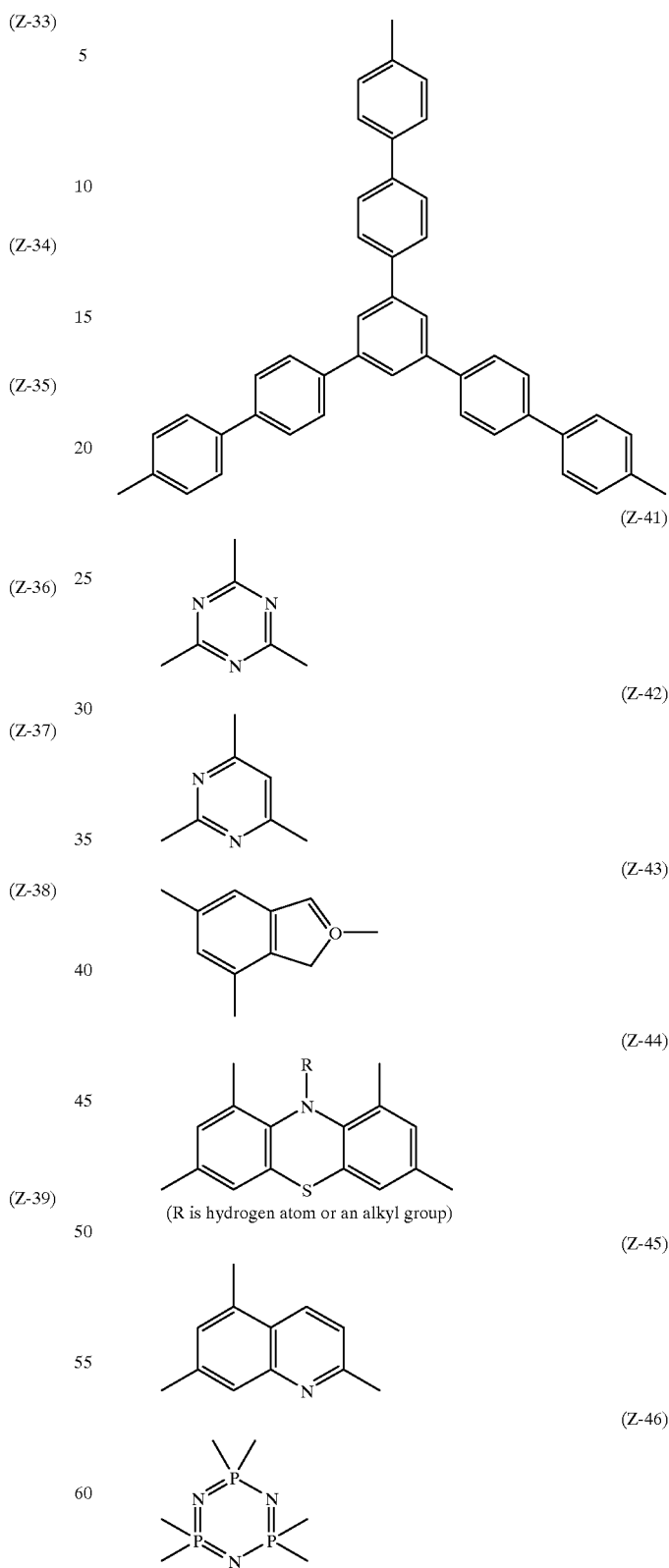

-continued (Z-47)
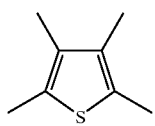

(Z-48)
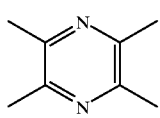

(Z-49)
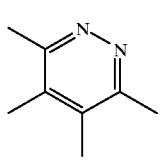

(Z-50)
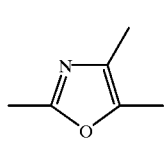

(Z-51)
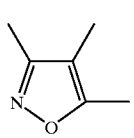

(Z-52)
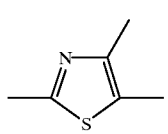

(Z-53)
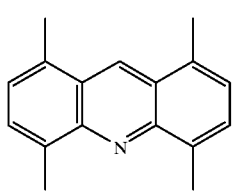

(Z-54)
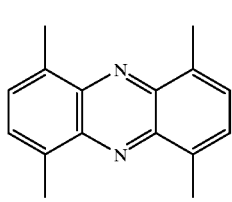

(Z-55)
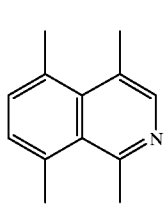

-continued (Z-56)
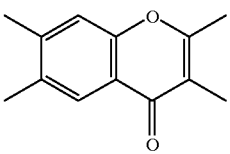

(Z-57)
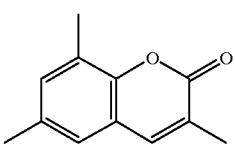

(Z-58)
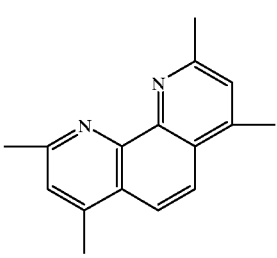

(X-1) —CH$_2$—, (X-2) —O—, (X-3) —NH—, (X-4) 
$$-\underset{\phantom{R}}{\overset{R}{N}}-,$$

(X-5) 
$$-\underset{\overset{\parallel}{O}}{C}O-,$$

(X-6) 
$$-\underset{\overset{\parallel}{O}}{C}NH-,$$

(X-7) 
$$-\underset{\overset{\parallel}{O}}{C}\underset{\phantom{R}}{\overset{R}{N}}-,$$

(X-8) 
$$-O\underset{\overset{\parallel}{O}}{C}NH-,$$

(X-9) 
$$-O\underset{\overset{\parallel}{O}}{C}\underset{\phantom{R}}{\overset{R}{N}}-,$$

(X-10) —S—, (X-11) —N=N—, (X-12) —CH=N—, (X-13) —CH=CH—

-continued
(Y-1) 
(Y-2) 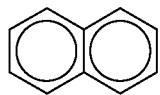
(Y-3) 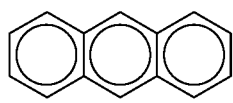
(Y-4) 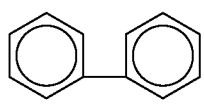
(Y-5) 
[X = O, N, S]
(Y-6) 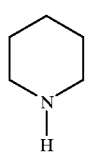
(Y-7) 
(Y-8) 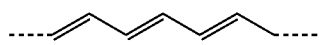
(Y-9) 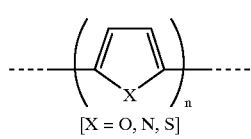
[X = O, N, S]
(Y-10) 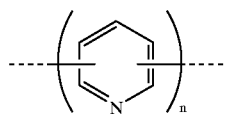
(Y-11) 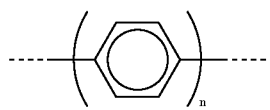
(Y-12) 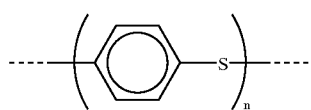
(Y-13) 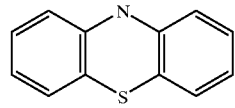
(Y-14) 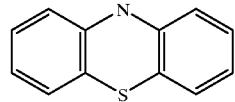
(Y-15) 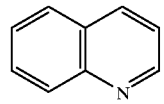
(Y-16) 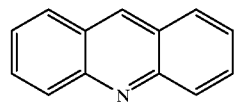
(Y-17) 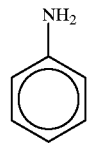
(Y-18) 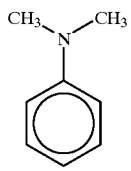
(Y-19) 
(Y-20) 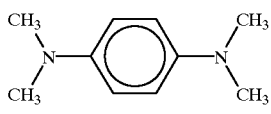
(Y-21) 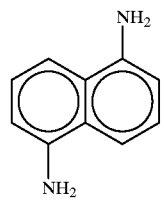
(Y-22) 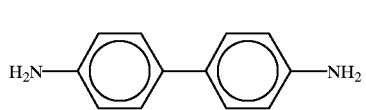
(Y-23) 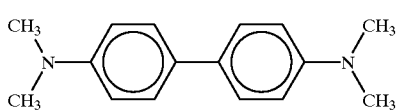

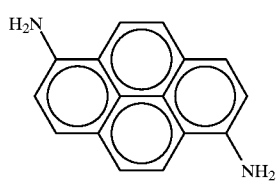
(Y-24)
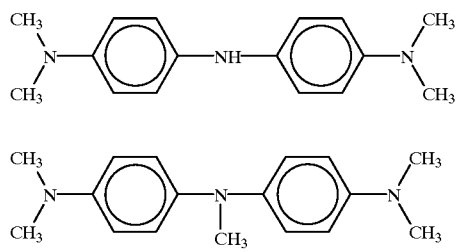
(Y-25)
(Y-26)
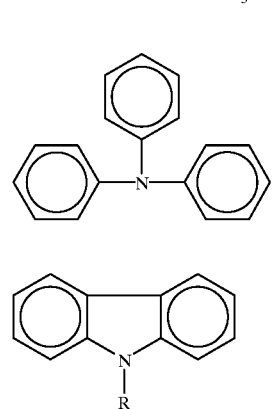
(Y-27)
(Y-28)
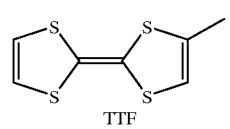
TTF
(Y-29)
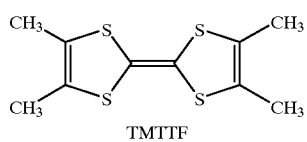
TMTTF
(Y-30)
DBTTF
(Y-31)
MHTTF
(Y-32)
BEDT-TTF
(Y-33)
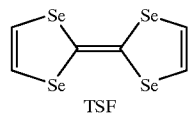
TSF
(Y-34)
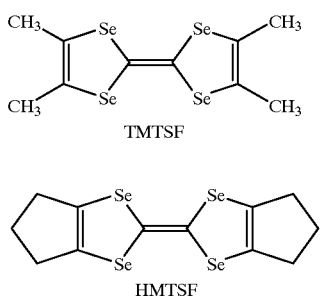
TMTSF
(Y-35)
HMTSF
(Y-36)
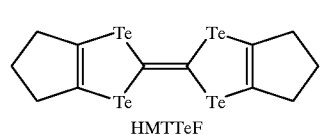
HMTTeF
(Y-37)
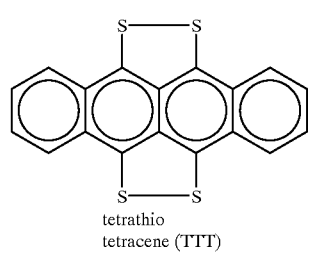
tetrathio tetracene (TTT)
(Y-38)
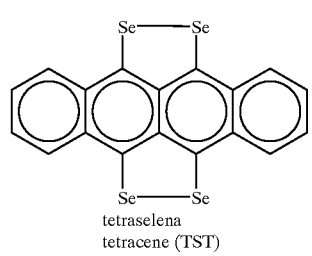
tetraselena tetracene (TST)
(Y-39)
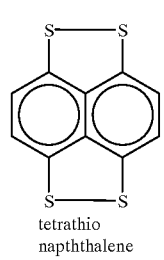
tetrathio napththalene
(Y-40)
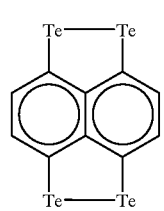
(Y-41)

(Y-42)
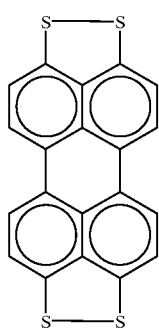
(Y-43)
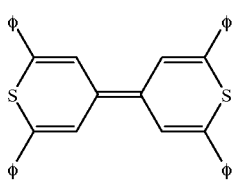
tetraphenyl bithio
pyranylene (BTP)
[φ denotes a phenyl goup]
(Y-44)
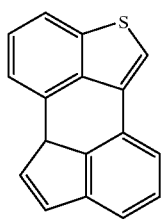
bibenzothiophene
(BBT)
(Y-45)
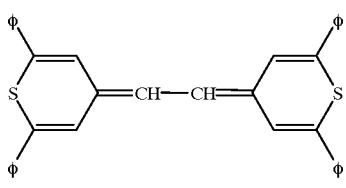
[φ denotes a phenyl group]
(Y-46)
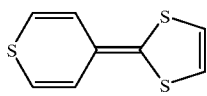
(Y-47)
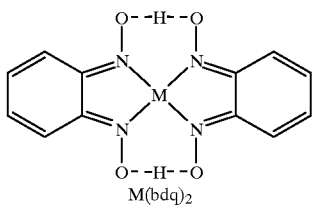
ferrocene
(Y-48)
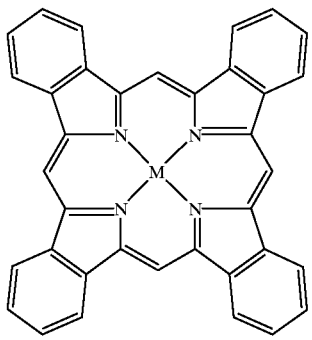
phthalocyanine M(Pc)
(Y-49)
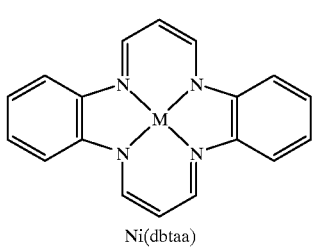
Ni(dbtaa)
(Y-50)
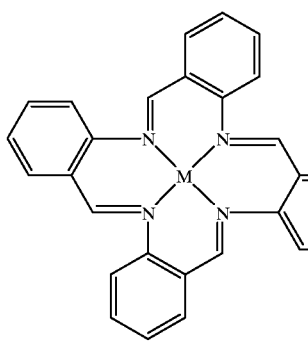
M(TAAB)
[M represents a metal atom]
(Y-51)
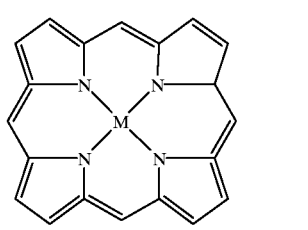
porphyrin
(Y-52)
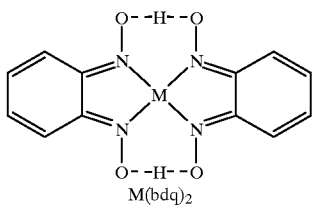
M(bdq)₂

(Y-53)
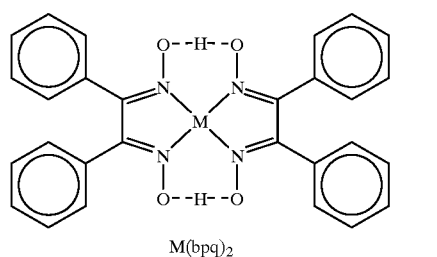
M(bpq)₂
(Y-54)
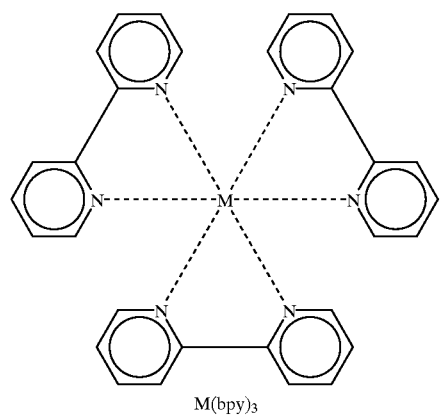
M(bpy)₃
(Y-55)
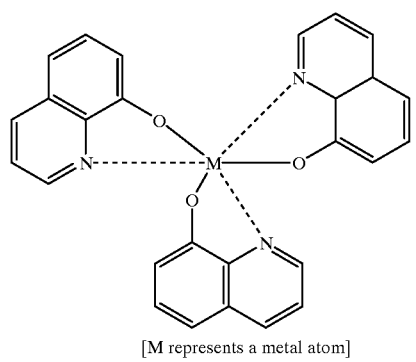
[M represents a metal atom]
(Y-56)
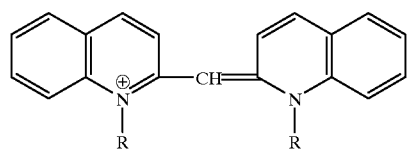
(Y-57)
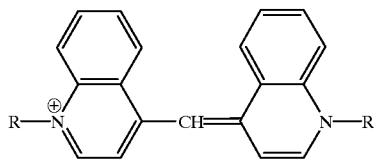
(Y-58)
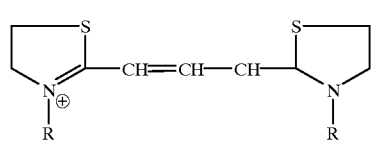
(Y-59)
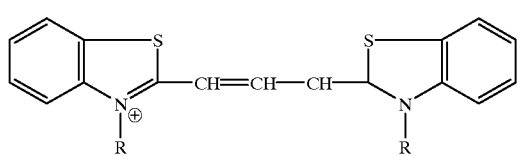
(Y-60)
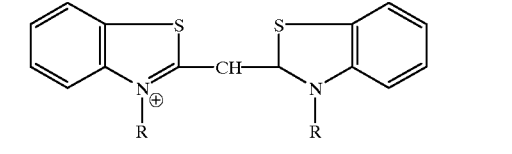
(Y-61)
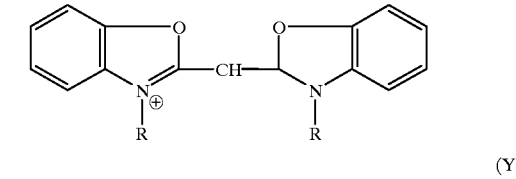
(Y-62)
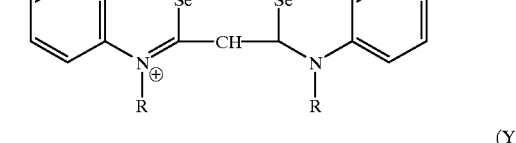
(Y-63)
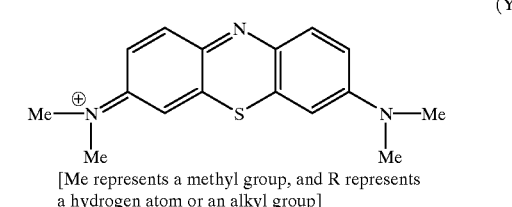
[Me represents a methyl group, and R represents a hydrogen atom or an alkyl group]
(Y-64)
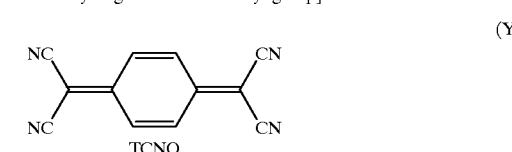
TCNQ
(Y-65)
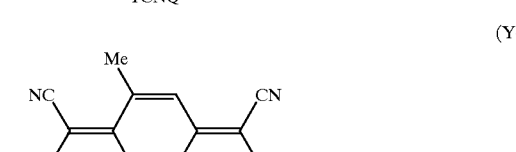
Me₂TCNQ
(Y-66)
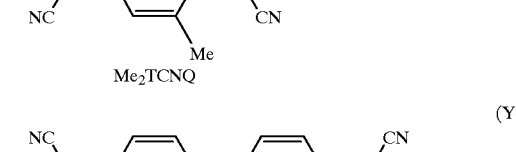
TCNDQ
(Y-67)
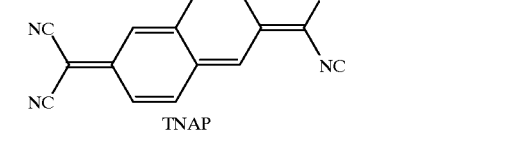
TNAP (Y-68) DTF (Y-69) dicyano benzene (PCNB)

(Y-70)

(Y-71) dicyano naphthoquinone (Y-72) naphthoquinone (Y-73) 2,3-dichloro naphthoquinone (Y-74)

(Each of R₁–R₄ represents a hydrogen atom, a halogen atom, an alkyl group, an alkenyl group, an aryl group, an alkoxy group, an alkyl thio group, an alkoxy carbonyl group. a cyano group, a nitro group, a hydroxyl group, an amino group, a carboxyl group, an acetyl group or a formyl group.)

(Y-75) p-nitro cyano benzene (Y-76) 1,3-dinitrobenzene (Y-77) TNF (Y-78) 1,3,5-trinitrobenzene (Y-79) p-dinitrobenzene (Y-80)

(Each of $R_5$ to $R_8$ represents a hydrogen atom, a halogen atom, an alkyl group, an alkenyl group, an aryl group, an alkoxy group, an alkyl thio group, an alkoxy carbonyl group. a cyano group, a nitro group, a hydroxyl group, an amino group, a carboxyl group, an acetyl group or a formyl group.)

(Y-81)

(R represents an alkyl group or an aryl group.)

(1)
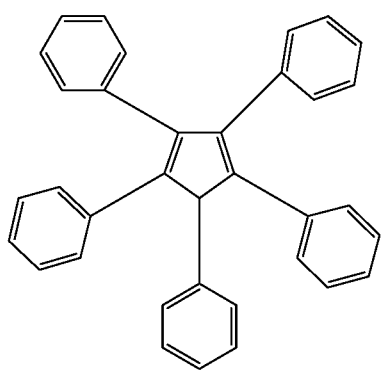
(2)
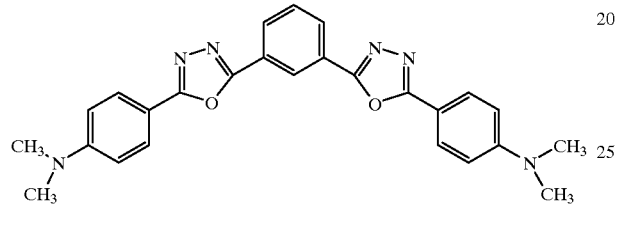
(3)
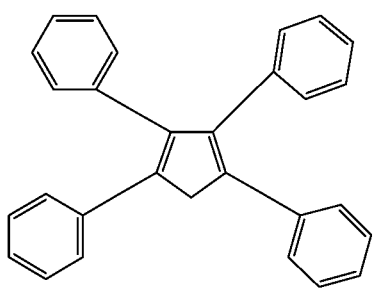
(4)
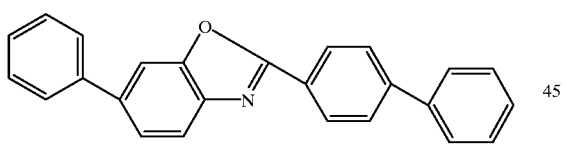
(5)
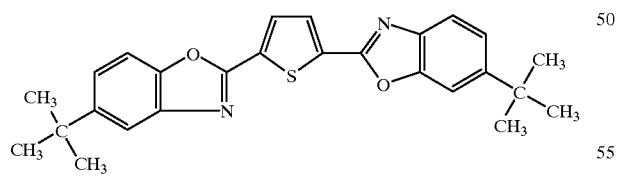
(6)
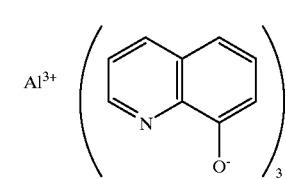
(7)
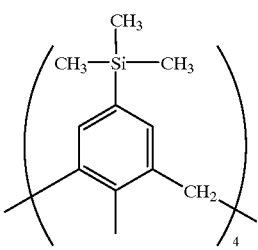
(8)
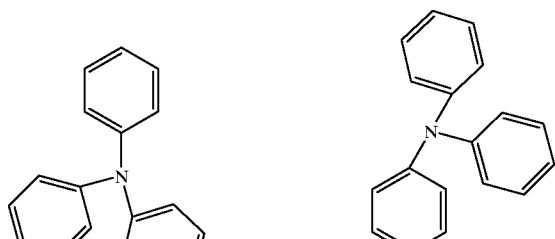
(9)
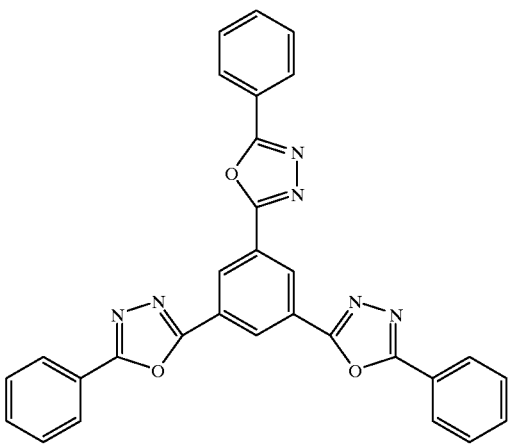

-continued

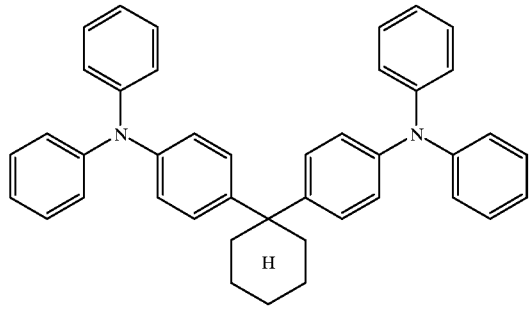

(10)

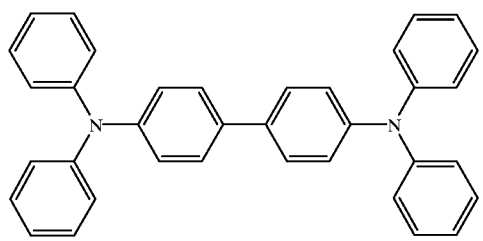

(11)

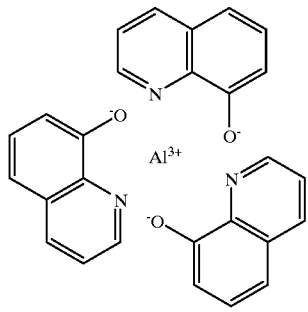

(12)

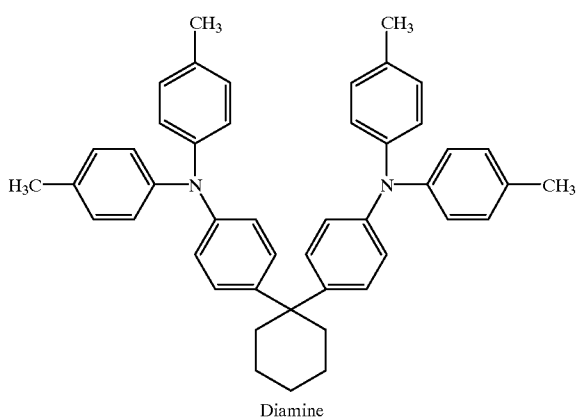

(13)
Diamine

-continued

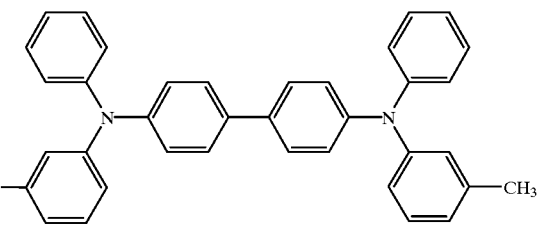

(14)
TAD

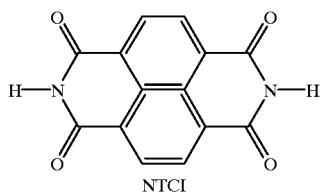

(15)
NTCI

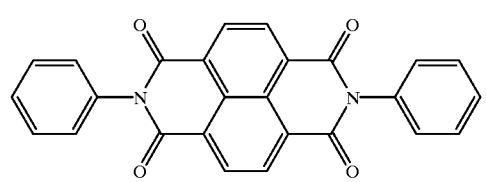

(16)
DPNTCI

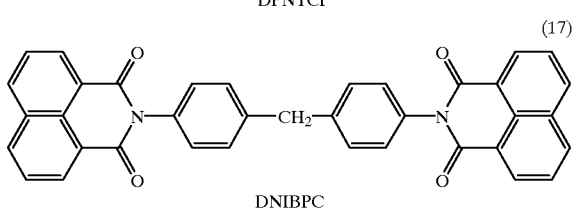

(17)
DNIBPC

The etching mask 4 can be formed by coating the substrate 1 with a solution prepared by dissolving the mask material 3 described above in a solvent by, for example, a spin coating method or by vacuum deposition of the mask material 3 on the substrate 1.

The mask material 3 that can be used in the present invention also includes high molecular weight polymer materials such as polyethylenes; chlorinated polyethylenes; ethylene copolymers such as ethylene-vinyl acetate copolymer, and ethylene-acrylic acid-maleic anhydride copolymer; polybutadienes; polyesters such as polyethylene terephthalate, polybutylene terephthalate and polyethylene naphthalate; polypropylenes; polyisobutylenes; polyvinyl chlorides; polyvinylidene chlorides; polyvinyl acetates; polyvinyl alcohols; polyvinyl acetals; polyvinyl butyrals; tetrafluoroethylene resins; trifluorochloroethylene resins; ethylene fluoride-propylene resins; vinylidene fluoride resins; vinyl fluoride resins; tetrafluoroethylene copolymers such as tetrafluoroethylene-perfluoroalkoxyethylene copolymer, tetrafluoroethylene-perfluoroalkylvinylether copolymer, tetrafluoroethylene-hexafluoropropylene copolymer and tetrafluoroethylene-ethylene copolymer; fluorine-containing resins such as a fluorine-containing polybenzo-oxazol; acrylic resins; methacrylic resins such as polymethylmethacrylate (PMMA): fumarate resins such as polydiisobutyl fumarate; polyacrylonitriles; styrene copolymers such as acrylonitrile-butadiene-styrene-methacrylic acid copolymer, and styrene-acrylonitrile copolymer; ionic polymers such as polysodiumstyrene sulfonate and polysodium acrylate; acetal resins; polyamides such as nylon 66; gelatin; gum arabic; polycarbonates; polyester carbonates; cellulose resins; phenolic resins; urea resins; epoxy resins; unsaturated polyester resins; alkyd resins; melamine resins; polyurethanes; diaryl phthalate resins; polyphenylene oxides; polyphenylene sulfides; polysulfones; polyphenyl sulfones; silicone resins; polyimides; bismaleimide triazine resins; polyimide amides; polyether sulfones; polymethylpentenes; polyether ether ketones; polyether imides; polyvinyl carbazoles; and norbornene series non-crystalline olefins.

Where these high molecular weight materials are used as the mask material 3, the etching mask 4 can be formed by coating by a spin coating method the substrate 1 with a solution prepared by dissolving the mask material 3 in a solvent.

It should be noted that, if the mask material 3 is simply supplied to the surface of the substrate 1, it is possible for the self-assembly like agglomeration not to take place or to be rendered incomplete. In such a case, it is desirable to apply an annealing treatment to the mask material 3 supplied to the substrate surface at a temperature lower than the boiling point or sublimation point of the mask material 3 so as to promote the self-assembly like agglomeration. By the annealing treatment, the etching mask 4 shown in FIG. 1D can be obtained. Where the vacuum deposition method is employed, the self-assembly like agglomeration can be promoted by increasing the substrate temperature so as to activate the movements of molecules on the substrate surface.

Figure 1E:
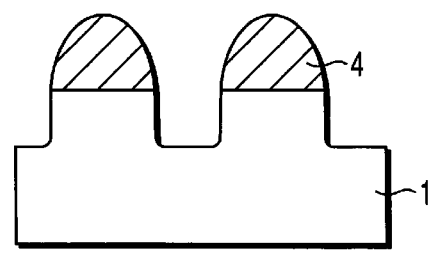

After formation of the etching mask 4, the substrate 1 is etched under the conditions similar to those of the ordinary etching so as to form a pattern corresponding to the pattern of the etching mask 4 on the surface region of the substrate 1, as shown in FIG. 1E.

In the method described above, the ultra thin film 2 is left unremoved when the substrate 1 is etched. However, the ultra thin film 2 is markedly lower in resistance to etching than the etching mask 4 and, thus, is removed easily. In many cases, the etching mask 4 is not required after completion of the etching and, thus, is removed subsequently, as required. In the method of the present invention, a fine pattern is formed as described above.

The first embodiment described above covers mainly the case where the surface region of the substrate 1 constitutes the object to be etched. However, it is also possible for a thin film formed on the substrate 1 to constitute the particular object. In this case, it is possible for the thin film formed on the substrate 1 to be a conductive thin film such as a metal thin film, a semiconductor thin film or an insulating thin film such as an oxide film.

The first embodiment described above covers mainly the case where the ultra thin film 2 is exposed to light and developed for obtaining the structure shown in FIG. 1B. To be more specific, a treatment similar to that applied to a photosensitive layer such as a resist film is applied to the ultra thin film 2 so as to obtain the structure shown in FIG. 1B. However, the structure shown in FIG. 1B can also be obtained by utilizing decomposition and removal by means of an energy beam irradiation. For example, where the substrate 1 consists of a silicon substrate and the ultra thin film 2 is formed of a native oxide film, the ultra thin film 2 is selectively irradiated with an energy beam such as a converged ion beam so as to remove the irradiated portion of the ultra thin film 2 and, thus, to selectively expose the substrate surface to the outside.

Incidentally, the surface of the native oxide film is terminated with silanol groups that exhibit a high reactivity with a silane coupling agent. Thus, after the surface of the substrate 1 is selectively exposed to the outside by selectively removing the ultra thin film 2 by the method described above, it is possible to allow the ultra thin film 2 to react with a silane coupling agent. It is also possible to modify chemically the ultra thin film 2 before formation of the etching mask 4 so as to change the surface energy.

Further, in the first embodiment, any one of the irradiated portion and the non-irradiated portion may be removed in irradiating the ultra thin film 2 for obtaining the structure shown in FIG. 1B. Also, in the first embodiment, the etching mask 4 is formed on the exposed surface of the substrate 1 constituting the object to be etched. However, the etching mask 4 can also be formed on the ultra thin film 2 by selecting appropriately the materials of the object to be etched, the ultra thin film 2 and the mask material 3.

A second embodiment of the present invention will now be described. The first embodiment comprises the steps of selectively removing the ultra thin film 2 and supplying the mask material 3 onto the substrate surface. The second embodiment comprises an additional step interposed between these two steps of the first embodiment. Specifically, an ultra thin film consisting of a material differing from the material of the ultra thin film 2 is selectively formed in the exposed portion of the substrate 1 in the additional step of the second embodiment noted above. Only that portion of the second embodiment which differs from the first embodiment is explained in the following description while omitting the overlapping portion.

FIGS. 2A to 2D are cross sectional views schematically showing collectively a pattern forming method according to the second embodiment of the present invention. According to the second embodiment of the present invention, a fine pattern is formed as follows.

In the first step, a structure shown in FIG. 1B is obtained by the method similar to that described previously in conjunction with the first embodiment. The surface region of the substrate 1 constitutes an object to be etched in the second embodiment as in the first embodiment.

Figure 2A:
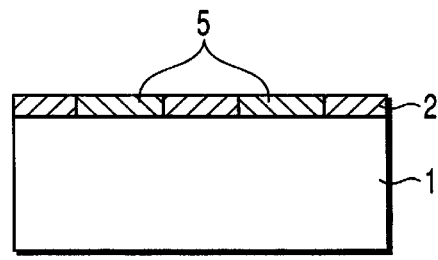
FIGS. 2A to 2D are cross sectional views collectively showing schematically a pattern forming method according to second and third embodiments of the present invention.

In the next step, an ultra thin film 5 is selectively formed in the exposed portion of the substrate 1, as shown in FIG. 2A. As already described in conjunction with the first embodiment, the exposed portion of the substrate 1 and the surface of the ultra thin film 2 differ from each other in the surface energy. Therefore, it is possible to allow a suitable compound to be selectively adsorbed on the exposed portion of the substrate 1 so as to form the ultra thin film 5. In this case, the ultra thin film 5 is formed in general in the form of an ultra thin film consisting of a monomolecular film.

Figure 2B:
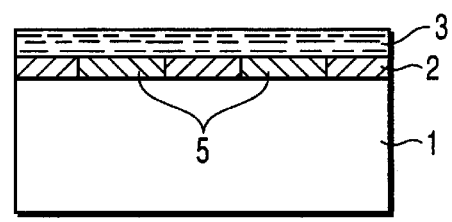
Figure 2C:
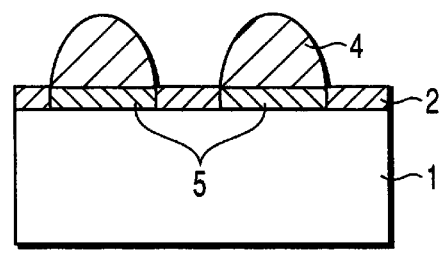

After formation of the ultra thin film 5, the mask material 3 is supplied onto the ultra thin films 2 and 5 formed on the substrate 1, as shown in FIG. 2B. Where the ultra thin films 2 and 5 differ from each other in the surface energy, the mask material 3 is selectively agglomerated on any one of the ultra thin films 2 and 5 by the mechanism similar to that described previously in conjunction with the first embodiment. As a result, the etching mask is obtained 4 as shown in FIG. 2C. In this case, the mask material 3 is agglomerated on the ultra thin film 5.

Figure 2D:
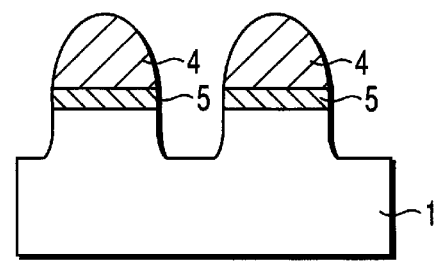

After formation of the etching mask 4, the substrate 1 is etched under the conditions similar to those of the ordinary etching so as to form a pattern conforming with the pattern of the etching mask 4 in the surface region of the substrate 1, as shown in FIG. 2D.

The ultra thin film 2 is left unremoved when the substrate 1 is etched. However, the ultra thin film 2 is markedly lower in the resistance to etching than the etching mask 4 and, thus, is removed easily. Also, in many cases, the etching mask 4 and the ultra thin film 5 become unnecessary after completion of the etching and, thus, these etching mask 4 and ultra thin film 5 are removed, as desired. According to the method of this embodiment, a fine pattern is formed as described above.

In the second embodiment, a surface energy distribution is formed on the surface of the substrate 1 by using two kinds of ultra thin films. Alternatively, it is also possible to use at least three kinds of thin films. For example, another ultra thin film may be formed on the ultra thin film 2.

The second embodiment described above covers mainly the case where the surface region of the substrate 1 constitutes the object to be etched. Alternatively, it is possible for a thin film formed on the substrate 1 to constitute the particular object. Further, in the second embodiment, the etching mask 4 is formed on the ultra thin film 5. However, it is possible to form the etching mask 4 on the ultra thin film 2 by selecting appropriately the materials of the ultra thin film 2, the ultra thin film 5 and the mask material 3.

A third embodiment of the present invention will now be described with reference to FIGS. 1A and 2A to 2D. In the third embodiment, the first and second surface regions are formed on the surface of the substrate 1 by modifying the ultra thin film 2. Only that portion of the third embodiment which differs from the first embodiment is to be described while omitting the description of the overlapping portion.

According to the method of the third embodiment, the structure shown in FIG. 1A is obtained by the method similar to that described previously in conjunction with the first embodiment. The surface region of the substrate 1 constitutes the object to be etched in the third embodiment, too.

In the next step, the ultra thin film 2 is irradiated with an energy beam such as an electron beam. If the ultra thin film contains a material that gives rise to reaction upon irradiation with the energy beam, it is possible to change the surface energy of the irradiated portion. For example, where the ultra thin film 2 contains a compound having a t-butyl ester group, the t-butyl ester group can be converted into a carboxyl group by the irradiation with an electron beam. Also, where the substrate 1 is a silicon substrate and the ultra thin film 2 consists of hydrogen atoms terminating on the surface of the substrate 1, the irradiation of the substrate 1 with an energy beam such as a converged electron beam brings about oxidation so as to permit the surface of the irradiated portion to be terminated with silanol groups.

As described above, the ultra thin film 2 is partially modified so as to obtain the ultra thin film 5 as shown in FIG. 2A. Then, the processes similar to those described previously in conjunction with the second embodiment are applied so as to form a fine pattern.

The third embodiment described above covers mainly the case where the surface region of the substrate 1 constitutes the object to be etched. Alternatively, it is also possible for a thin film formed on the substrate 1 to constitute the particular object. Also, in the third embodiment, the etching mask 4 is formed on the ultra thin film 5. However, it is also possible to form the etching mask 4 on the ultra thin film 2 by selecting appropriately the materials of the ultra thin film 2 and the mask material 3.

A forth embodiment of the present invention will now be described. The fourth embodiment differs from the first to third embodiments in that the ultra thin film 2 is partially removed physically by contact with the ultra thin film 2. For example, where the substrate 1 shown in FIG. 1A is a silicon substrate and the ultra thin film 2 is a native oxide film, a needle tip is pressed against the ultra thin film 2. As a result, the ultra thin film 2 is partially removed to expose selectively the surface of the substrate 1 to the outside, as shown in FIG. 1B.

Then, the processes similar to those described previously in conjunction with the first or second embodiment are applied. In the method of the fourth embodiment, a fine pattern is formed as described above.

In the fourth embodiment, it is not absolutely necessary to remove the ultra thin film 2 to expose the surface of the substrate 1. It suffices to form a shallow scratch-like concave portion on the surface of the ultra thin film 2. In this case, the mask material 3 is supplied first onto the surface of the ultra thin film 2 by selecting appropriately the materials of the ultra thin film 2 and the mask material 3 and by employing a vacuum deposition method.

The nucleus formation of the mask material 3 on the ultra thin film 2 takes place selectively in the scratch-like concave portion. Therefore, the mask material 3 grows selectively in the concave portion of the ultra thin film 2, with the result that the etching mask 4 patterned to conform with the pattern of the concave portion is formed on the ultra thin film 2.

After formation of the etching mask 4, the processes described previously in conjunction with the first to third embodiments are applied to form a fine pattern.

Where the etching mask 4 is formed by forming a shallow concave portion on the surface of the ultra thin film 2, it is possible for the self-assembly like agglomeration not to take place or is rendered incomplete if the mask material 3 is simply supplied on the surface of the substrate 1 by means of a vacuum deposition. In such a case, it is desirable to increase the temperature of the substrate 1 in carrying out the vacuum deposition. If the substrate temperature is increased, the movement of the molecules on the surface of the substrate 1 is made vigorous so as to promote the self-assembly like agglomeration.

As described above, a physical contact is utilized in place of the light irradiation for forming the etching mask 4 in the fourth embodiment. It should also be noted that, since the ultra thin film 2 is very thin, the processing can be achieved easily with a high accuracy by utilizing a physical contact, making it possible to form a fine pattern with a high resolution.

In the first to fourth embodiments, it is possible to utilize a probe for a scanning probe microscope such as a probe for a scanning tunnel microscope (STM), a probe for an atomic force microscope (AFM) or a probe for a near-field scanning optical microscope (NSOM) for forming the first and second surface regions.

In the case of using, for example, an STM probe or an AFM probe, the ultra thin film 2 can be patterned by depicting an electron beam pattern on the ultra thin film 2 using the probe as an electron beam source, followed by developing the electron beam pattern. Also, in the case of using the STM probe or the AFM probe, the ultra thin film 2 can be patterned by locally applying a voltage to the ultra thin film 2 for decomposing and removing selectively the ultra thin film 2. Further, the ultra thin film 2 can be selectively removed physically by bringing the STM probe or the AFM probe into contact with the ultra thin film 2. Still further, in the case of using an NMOS probe such as an optical fiber having a sharpened edge, the ultra thin film 2 can be patterned by selectively irradiating the ultra thin film 2 with an ultraviolet light or the like emitted from the sharpened edge, followed by developing the pattern of the irradiation.

According to the first to fourth embodiments described above, the first thin film 2 to be patterned is formed solely for forming the first and second surface regions differing from each other in the surface state on the surface of the object 1 to be etched. Therefore, the first thin film 2 is not required to be resistant to etching, making it possible to form the first thin film 2 in the form of an ultra thin film. It follows that the first thin film 2 can be patterned with a high resolution in the method according to any of the first to fourth embodiments described above.

It should also be noted that, in any of the first to fourth embodiments, the second thin film 4 used as an etching mask is formed in a self-assembly fashion on any one of the first and second surface regions. Further, the second thin film 4 is amorphous in the first to fourth embodiments. It follows that it is possible to allow the pattern of the second thin film 4 to conform with any one of the first and second surface regions with a high accuracy. In other words, a fine pattern can be formed with a high resolution in any of the first to fourth embodiments of the present invention described above.

The method according to any of the first to fourth embodiments can be applied to the manufacture of a device having a fine pattern such as a semiconductor device or a recording medium. Since the method according to any of the first to fourth embodiments of the present invention makes it possible to form a fine pattern with a high resolution as already pointed out, a device having a higher degree of integration, a device having a higher density or a miniaturized device can be obtained by applying the method of any of the first to fourth embodiments to the manufacture of a device.

Some examples of the present invention will now be described.

EXAMPLE 1

Octadecyl trimethoxy silane and TAD represented by chemical formula (14) were used for forming the ultra thin film 2 and the etching mask 4, respectively. In this Example, the surface region of a quartz substrate 1 was patterned by the method described previously in conjunction with the first embodiment of the present invention.

Figure 3:
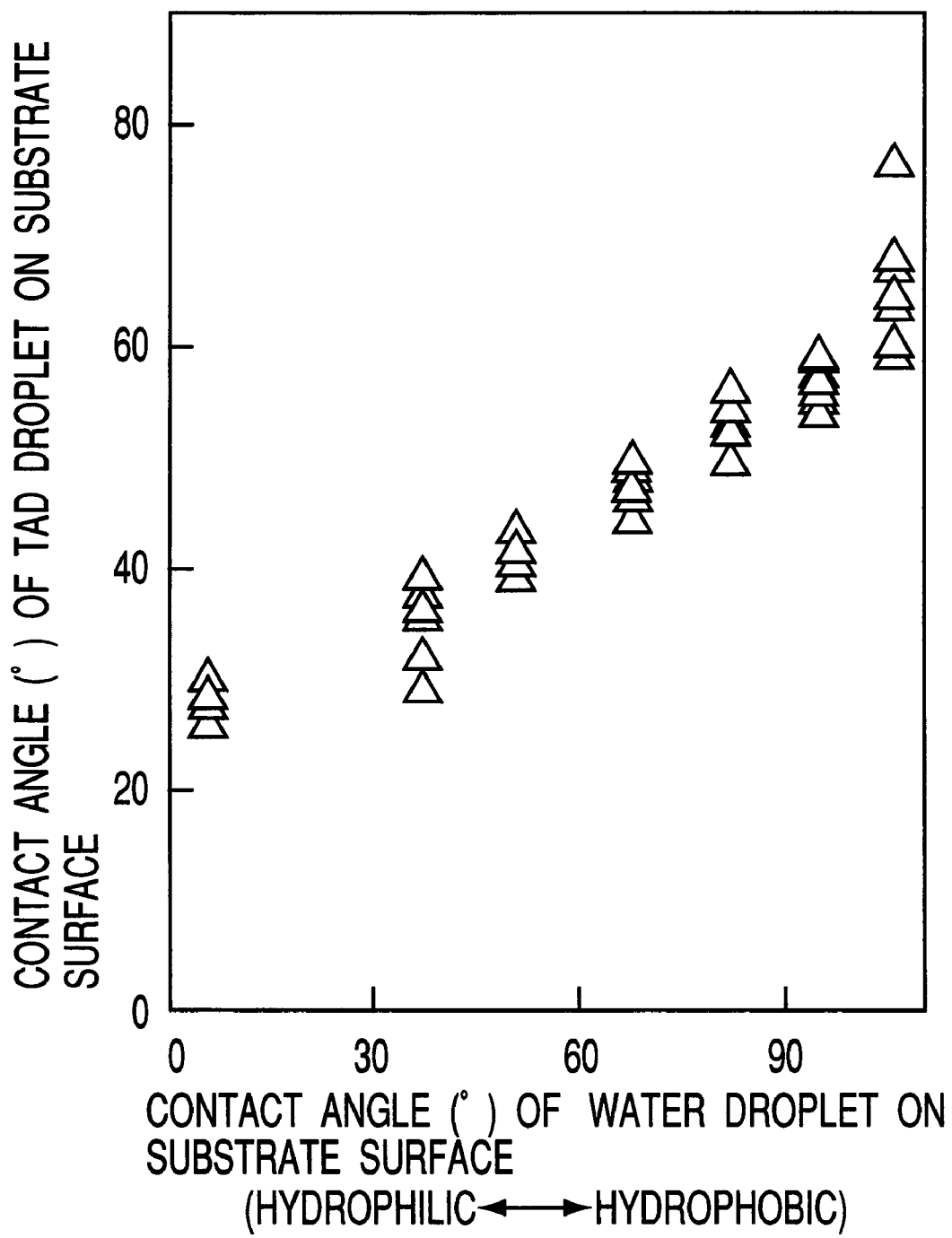
FIG. 3 is a graph showing the relationship between the contact angle of a water droplet relative to a substrate and the contact angle of a TAD droplet relative to the substrate.

In the first step, various substrates were prepared and the contact angle of the TAD droplet relative to the substrate was measured. Likewise, the contact angle of a water droplet relative to the substrate was also measured. FIG. 3 shows the results.

Specifically, the relationship between the contact angle of the water droplet relative to the substrate and the contact angle of the TAD droplet relative to the substrate is shown in the graph of FIG. 3. In the graph of FIG. 3, the contact angle of the water droplet relative to the substrate is plotted on the abscissa. Also, the contact angle of the TAD droplet relative to the substrate is plotted on the ordinate.

As shown in FIG. 3, the contact angle of the TAD droplet and the contact angle of the water droplet are changed similarly depending on the substrate used. Specifically, where the contact angle of the water droplet is small, the contact angle of the TAD droplet is also small. Likewise, where the contact angle of the water droplet is large, the contact angle of the TAD droplet is also large. Where the contact angle of the water droplet is small, the substrate used for the measurement is considered to be hydrophilic. It follows that the TAD droplet is present more stably on the hydrophilic surface than on the hydrophobic surface.

Then, the surface of the quartz substrate 1 was patterned as follows. The description will be made with reference to FIGS. 1A to 1E. In the first step, one major surface of the quartz substrate 1 was washed with a concentrated sulfuric acid. Then, the ultra thin film 2 consisting of a monomolecular film was formed as shown in FIG. 1A by supplying a silane coupling agent of octadecyl trimethoxy silane onto said one major surface of the substrate 1.

Then, a lattice pattern was depicted on the ultra thin film 2 by using an electron beam image-depicting device. The electron beam was converged to have a spot diameter of 10 nm. Also, the period of the line constituting the lattice was set at 20 nm.

After the electron beam image was depicted as above, the ultra thin film 2 was developed. Specifically, the ultra thin film 2 was washed with ethanol to remove the non-irradiated portion of the ultra thin film 2 to expose the surface of the quartz substrate 1 as shown in FIG. 1B.

Then, TAD was supplied in an amount corresponding to a TAD thin film having a thickness of 10 nm by a vacuum deposition on the quartz substrate 1 having the ultra thin film 2 formed thereon, as shown in FIG. 1C. As a result, the etching mask 4 consisting of TAD was formed selectively on the exposed surface of the quarts substrate 1, as shown in FIG. 1D. The etching mask 4 was amorphous and sufficiently thicker than the ultra thin film 2.

Figure 4:
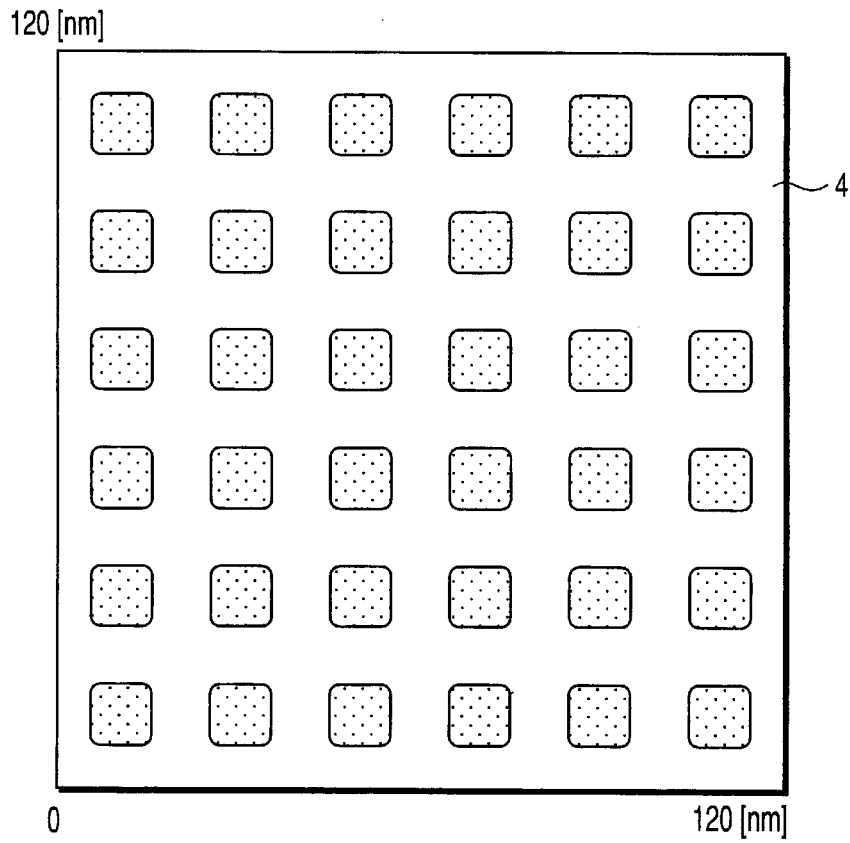
FIG. 4 schematically shows an AFM image of the etching mask prepared by the pattern forming method in Example 1 of the present invention described herein.

FIG. 4 schematically shows an AFM image of the etching mask thus formed. As shown in the drawing, the etching mask 4 formed a lattice pattern.

After formation of the etching mask 4, a plasma etching was applied to etch the ultra thin film 2 and the surface region of the substrate 1, as shown in FIG. 1E, thereby forming lattice-shaped projections in the surface region of the quartz substrate 1. The surface of the quarts substrate 1 was observed with an AFM. The width of the line constituting the lattice was found to be 10 nm, and the period of the line was found to be 20 nm.

EXAMPLE 2

Stearyl mercaptan and TAD were used in this Example for forming the ultra thin film and the etching mask, respectively. In this Example, a Cr thin film and a Au thin film formed on the quartz substrate were patterned by the method described previously in conjunction the first embodiment.

In the first step, a Cr thin film having a thickness of 5 nm and a Au thin film having a thickness of 50 nm were successively formed by vapor deposition on one major surface of the quartz substrate. Then, the substrate was dipped in an ethanol solution containing 1 mM of an alkyl thiol of stearyl mercaptan [HS(CH$_2$)$_{17}$CH$_3$] to form an ultra thin film on the Au film.

Then, a predetermined pattern was depicted on the ultra thin film by using an electron beam image-depicting device. Further, the ultra thin film was washed with ethanol to remove selectively the electron beam-irradiated portion of the ultra thin film to expose in a lattice shape the surface of the Au thin film. The electron beam pattern was depicted on the ultra thin film such that the width of the line constituting the lattice was 100 nm and the period of the line was 200 nm.

In the next step, TAD was supplied in an amount corresponding to a TAD thin film having a thickness of 50 nm by vacuum deposition to form an ultra thin film on the quartz substrate. As a result, an etching mask consisting of TAD was formed selectively on the exposed surface of the Au thin film. The etching mask thus formed was amorphous and sufficiently thicker than the ultra thin film.

After formation of the etching mask, the ultra thin film was decomposed and removed by irradiating the ultra thin film with an ultraviolet light having a wavelength of 356 nm.

Further, the Au thin film and the Cr thin film were successively removed by wet etching, followed by removing the etching mask made of TAD by washing the substrate with acetone. Incidentally, $I_2/KI$ solution was used as an etchant for etching the Au thin film.

Figure 5:
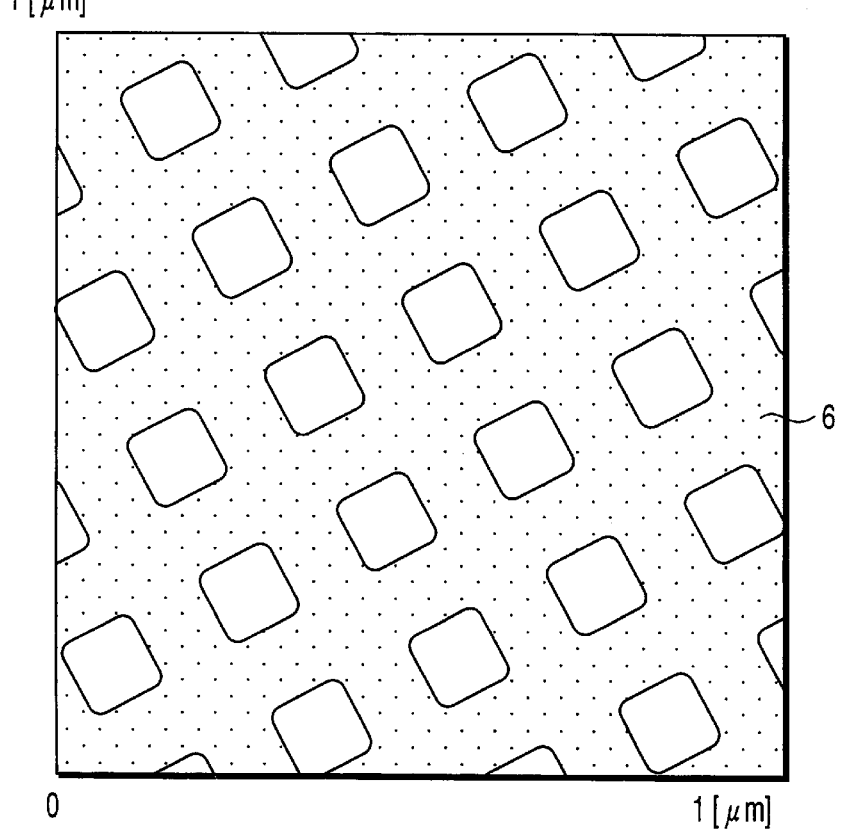
FIG. 5 schematically shows NSOM images of the Au thin film and a Cr thin film patterned by the pattern forming method in Example 2 of the present invention described herein.

FIG. 5 schematically shows an NSOM image of the quartz substrate after patterning of the Au thin film and the Cr thin film. An NSOM probe having an aperture diameter of 50 nm was used for observation of the NSOM image.

As shown in FIG. 5, a metal thin film 6 consisting of the Au thin film and the Cr thin film formed a lattice pattern. Also, the metal thin film 6 intercepts the light transmission, and the structure thus formed can be used in, for example, an ultra high density recording medium utilizing the near-field of light.

EXAMPLE 3

Octadecyl trimethoxy silane and polymethyl methacrylate (PMMA) were used in this Example for forming the ultra thin film 2 and the etching mask 4. Also, in this Example, the surface region of the quartz substrate was patterned by the method described previously in conjunction with the first embodiment. The description will be made with reference to FIGS. 1A to 1E.

In the first step, one major surface of the quartz substrate 1 was washed with a concentrated sulfuric acid. Then, the ultra thin film 2 consisting of a monomolecular film was formed as shown in FIG. 1A by supplying a silane coupling agent of octadecyl trimethoxy silane onto said one major surface of the substrate 1.

Then, a lattice pattern was depicted on the ultra thin film 2 by using an electron beam image-depicting device. In this step, the electron beam was converged so as to set the spot diameter to 10 nm. Also, the period of the line constituting the lattice was 20 nm.

After the lattice pattern was depicted, the ultra thin film 2 was developed. Specifically, the ultra thin film 2 was washed with ethanol to remove the electron beam-irradiated portion of the ultra thin film 2 to selectively expose the surface of the quartz substrate 1, as shown in FIG. 1B.

Then, the surface of the quartz substrate 1 having the ultra thin film 2 formed thereon was coated with a chlorobenzene solution of PMMA by a spin coating method, as shown in FIG. 1C. As a result, the etching mask 4 consisting of PMMA was formed selectively on the exposed surface of the substrate 1, as shown in FIG. 1D. The etching mask 4 was amorphous and sufficiently thicker than the ultra thin film 2.

After formation of the etching mask 4, a plasma etching was applied to etch the ultra thin film 2 and the surface region of the substrate 1, as shown in FIG. 1E, thereby forming a lattice-shaped projection in the surface region of the quartz substrate 1. The surface of the quartz substrate 1 was observed with an AFM. The width of the line constituting the lattice was found to be 10 nm, and the period of the line was found to be 20 nm.

Comparative Example

A surface region of the quartz substrate 1 was patterned as in Example 3, except that the etching mask 4 was formed by selectively irradiating the thin film of PMMA with an electron beam in place of using the ultra thin film 2.

Specifically, a thin film of PMMA was formed first by supplying a chlorobenzene solution of PMMA onto one major surface of the quarts substrate 1 by a spin coating method. Then, the thin film was patterned by using an electron beam to form the etching mask 4. Further, the ultra thin film 2 and the surface region of the substrate 1 were etched by a plasma etching, as shown in FIG. 1E.

The surface of the quartz substrate 1 after the plasma etching was observed with an AFM, resulting in failure to recognize a clear pattern unlike Example 3.

EXAMPLE 4

In this Example, two kinds of ultra thin films were formed by using stearyl mercaptan and mercapto hexadecanoic acid. On the other hand, TAD was also used for forming the etching mask. Also, a Cr thin film and a Au thin film formed on a silicon substrate were patterned by the method described previously in conjunction with the second embodiment.

In the first step, a Cr thin film having a thickness of 5 nm and a Au thin film having a thickness of 10 nm were formed successively by vapor deposition on one major surface of the silicon substrate. Then, a monomolecular film was formed by supplying an alkyl thiol of stearyl mercaptan $[HS(CH_2)_{17}CH_3]$ onto the Au film. The monomolecular film thus formed constituted a first ultra thin film.

Then, a lattice pattern was depicted on the first ultra thin film by using an electron beam image-depicting apparatus. In this step, the electron beam was converged to have the spot diameter of 10 nm. Also, the period of the line constituting the lattice was set at 20 nm.

Further, the lattice pattern thus depicted was developed. Specifically, the first ultra thin film was washed with ethanol to remove selectively the electron beam irradiated portion of the first thin film to expose the surface of the Au thin film.

Then, the silicon substrate having the first ultra thin film formed thereon was dipped in an ethanol solution containing 1 mM of mercapto hexadecanoic acid, $[HS(CH_2)_{15}COOH]$. As a result, the mercapto hexadecanoic acid molecules were selectively adsorbed on the exposed portion of the Au thin film to form a monomolecular film, which constituted a second ultra thin film.

After formation of the structure having the first and second ultra thin films arranged on the Au thin film, TAD was supplied in an amount corresponding to a TAD film having a thickness of 10 nm by a vacuum deposition on the surfaces of the first and second ultra thin films formed on the silicon substrate. As a result, an etching mask consisting of TAD was formed selectively on the second ultra thin film. The etching mask was amorphous and sufficiently thicker than any of the first and second ultra thin films.

The silicon substrate having the etching mask formed thereon was observed with an AFM. It was found that the etching mask was in the form of a lattice pattern, that the width of the line constituting the lattice was 10 nm, and that the period of the line was 20 nm.

Further, the first ultra thin film, the second ultra thin film and the Cr thin film were removed by plasma etching to form a lattice-shaped projection consisting of the Au thin film and the Cr thin film on the surface of the silicon substrate. The surface of the silicon substrate was observed with an AFM. It was found that a lattice-shaped projection consisting of the Au thin film and the Cr thin film was formed on the substrate surface, that the width of the line constituting the lattice was 10 nm, and that the period of the line was 20 nm.

EXAMPLE 5

Formed in this Example were the ultra thin film 2 formed of a monoatomic film consisting of hydrogen atoms and the ultra thin film 5 formed of a native oxide film. TAD was used in this Example for forming the etching mask, and a surface region of the silicon substrate 1 was patterned by the method described previously in conjunction with the third embodiment. The description will be made with reference to FIGS. 1A and 2A to 2D.

In the first step, one major surface of the silicon substrate 1 was treated with hydrofluoric acid to permit hydrogen atoms to be terminated on the major surface. Specifically, the ultra thin film 2 consisting of a monoatomic film of hydrogen was formed on one major surface of the silicon substrate 1, as shown in FIG. 1A.

Then, a lattice pattern was depicted on the ultra thin film 2 by using an electron beam image-forming apparatus. In this step, the electron beam was converged until the spot diameter was decreased to 10 nm. Also, the period of the line constituting the lattice was set at 20 nm.

After the lattice pattern was depicted on the ultra thin film 2, the silicon substrate 1 was left to stand under the air atmosphere for one hour. As a result, a native oxide film was selectively formed on the electron beam-irradiated portion of the ultra thin film 2. In other words, the ultra thin film 5 was formed as shown in FIG. 2A.

Then, TAD was supplied in an amount corresponding to a TAD film having a thickness of 10 nm by a vacuum deposition method onto the ultra thin films 2 and 5 formed on the silicon substrate 1, as shown in FIG. 2B. As a result, the etching mask 4 consisting of TAD was selectively formed on the ultra thin film 5, as shown in FIG. 2C. The etching film 4 thus formed was amorphous and sufficiently thicker than any of the ultra thin films 2 and 5.

The silicon substrate 1 having the etching mask 4 formed thereon was observed with an AFM. It was found that the etching mask 4 was in the form of a lattice pattern, that the width of the line constituting the lattice was 10 nm, and that the period of the line was 20 nm.

Further, the ultra thin film 2 and a surface region of the silicon substrate 1 were removed by a plasma etching to form a lattice-shaped projection on the surface of the silicon substrate 1. The surface of the silicon substrate was observed with an AFM. It was found that the width of the line constituting the lattice was 10 nm, and that the period of the line was 20 nm.

EXAMPLE 6

In this Example, a native oxide film was formed as an ultra thin film. Also, TAD was used for forming the etching mask, and a surface region of the silicon substrate was patterned by the method described previously in conjunction with the fourth embodiment.

In the first step, a native oxide film was formed as the ultra thin film on one major surface of the silicon substrate. Then, an AFM probe made of SiN was brought into contact with the ultra thin film to form a shallow scratch in the ultra thin film. A plurality of such scratches were formed 50 nm apart from each other in each of the vertical and lateral directions.

Then, TAD was supplied in an amount corresponding to a TAD film having a thickness of 5 nm by a vacuum deposition method onto that surface of the substrate which bore the scratches. Further, the silicon substrate was annealed at 150° C. for 5 minutes, thereby selectively forming the etching mask consisting of TAD in the scratch-formed position of the ultra thin film. The etching mask was amorphous and sufficiently thicker than the native oxide film.

The silicon substrate having the etching mask formed thereon was observed with an AFM. It was found that the etching mask consisted of a plurality of dome-shaped dots arranged on the silicon substrate. The diameter of the dot was found to be 20 nm, and the dots were arranged 50 nm apart from each other.

Then, the ultra thin film and a surface region of the substrate were removed by a plasma etching, thereby forming a lattice-shaped projection on the surface of the silicon substrate 1. Further, the etching mask was removed with acetone. The surface of the silicon substrate was observed with an AFM. It was found that a pattern consisting of a columnar projection having a diameter of 20 nm was formed on the surface of the substrate.

EXAMPLE 7

In this Example, mercapto hexadecanoic acid and stearyl mercaptan were used for forming two kinds of ultra thin films. Also, TAD was used for forming the etching mask. In this Example, a Cr thin film and a Au thin film formed on a glass disc were patterned by the method described previously in conjunction with the second embodiment to form a read-only recording medium.

In the first step, a Cr thin film having a thickness of 5 nm and a Au thin film having a thickness of 10 nm were successively formed by a vacuum deposition method on one major surface of an optically ground glass disc having a diameter of 120 mm and a thickness of 1.2 mm. Then, the glass disc was dipped in an ethanol solution containing 1 mM of mercapto hexadecanoic acid to form a monomolecular film of mercapto hexadecanoic acid on the Au thin film. The monomolecular film thus formed constituted the first ultra thin film.

Then, the first ultra thin film formed on the glass disc was irradiated with an electron beam while rotating the disc at 5000 rpm. The electron beam was converged in this step to have the spot diameter of 10 nm. Also, the axis of the electron beam was moved at a predetermined speed in a radial direction of the disc and the electron beam was irradiated in the form of pulses corresponding to predetermined data to form a spiral electron beam-irradiated portion on the first ultra thin film formed on the disk. The irradiated portion constituted the recording mark.

After the electron beam irradiation, the first ultra thin film was developed. Specifically, the first ultra thin film was washed with ethanol to remove selectively the electron beam-irradiated portion of the first ultra thin film to expose the surface of the Au thin film.

In the next step, the glass disc having the first ultra thin film formed thereon was dipped in an ethanol solution containing 1 mM of stearyl mercaptan. As a result, stearyl mercaptan was selectively adsorbed on the exposed portion of the Au thin film to form a monomolecular film, which constituted a second ultra thin film.

After formation of the structure having the first and second ultra thin films formed on the Au thin film, TAD was supplied in an amount corresponding to a TAD film having a thickness of 10 nm by a vacuum deposition method on the first and second ultra thin films formed on the glass disc. Further, the glass disc was annealed at 100° C. for 10 minutes to form selectively an etching mask consisting of TAD on the first ultra thin film. The etching film was amorphous and sufficiently thicker than any of the first and second ultra thin films.

Then, the second ultra thin film, the Au thin film and the Cr thin film were removed by a plasma etching, followed by removing the etching mask from the glass disc with acetone. As a result, a spiral projection consisting of the Au thin film and the Cr thin film was formed on the glass disc, thereby obtaining an optical information recording medium for exclusively reading data.

One major surface of the recording medium was irradiated with light by using a near-field optical head having a small opening having a diameter of 50 nm to detect the transmitted light emitted from the other major surface of the recording medium. As a result, 50% of contrast ratio was obtained, and the recorded information was reproduced with a sufficiently high accuracy.

A gate electrode having a width of 0.1 µm was formed by applying a process similar to that described above to a LSI process. In other words, it has been confirmed that the method of the present invention makes it possible to manufacture a device having a fine pattern such as a semiconductor device or a recording medium.

As described above, the first thin film is formed in the method of the present invention for solely forming first and second surface regions differing from each other in the surface state on a surface of an object to be etched and, thus, need not have a thickness required for the etching mask. Therefore, the first thin film can be formed very thin in the method of the present invention. Naturally, the first thin film can be patterned with a high resolution in the method of the present invention.

In the method of the present invention, the second thin film used as an etching mask is formed in a self-assembly fashion on any of the first and second surface regions thus formed. Further, the second thin film is amorphous in the method of the present invention. It follows that it is possible to allow the pattern of the second thin film to conform with the pattern of any of the first and second regions with a high accuracy.

To be more specific, the present invention provides a pattern forming method capable of forming a fine pattern with a high resolution. The present invention also provides a method of manufacturing a device that makes it possible to manufacture a device having a high density or a high degree of integration with a high accuracy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising the steps of:
   forming a first thin film on an object to be etched;
   forming a first surface region and a second surface region on a surface of the object by modifying or removing a portion of said first thin film, said first and second surface regions differing from each other in a surface state;
   forming a second thin film selectively on said first surface region by utilizing the difference in the surface state between the first and second surface regions, said second thin film being amorphous and thicker than the first thin film; and
   etching the object using the second thin film as an etching mask, wherein
   said step of forming said second thin film comprises supplying a mask material onto said first and second surface regions to form said second thin film, said mask material agglomerating selectively on said first surface region by the difference in the surface state between the first and second surface regions.

2. A pattern forming method according to claim 1, wherein said first thin film has a thickness of 100 nm or less.

3. A pattern forming method according to claim 1, wherein said first thin film is a monoatomic film or a monomolecular film.

4. A pattern forming method according to claim 1, wherein said second thin film exhibits a resistance to etching higher than that exhibited by said first thin film.

5. A pattern forming method according to claim 1, wherein said object to be etched is a substrate.

6. A pattern forming method according to claim 1, wherein said object to be etched is a thin film formed on a substrate.

7. A pattern forming method according to claim 1, wherein said step of forming said first and second surface regions is performed by partially removing said first thin film.

8. A pattern forming method according to claim 1, wherein said step of forming said first and second surface regions comprises partially removing said first thin film and allowing a material differing from the material of the first thin film to be adsorbed on the surface of the object exposed by partially removing the first thin film.

9. A pattern forming method according to claim 1, wherein said step of forming said first and second surface regions comprises partially modifying said first thin film.

10. A pattern forming method according to claim 1, wherein said step of forming said first and second surface regions comprises forming a recessed portion on the surface of said first thin film.

11. A pattern forming method according to claim 1, wherein said step of forming said first and second surface regions comprises partially exposing said first thin film to light.

12. A pattern forming method according to claim 11, wherein said step of forming said first and second surface regions further comprises removing any one of the exposed portion and non-exposed portion of the first thin film.

13. A pattern forming method according to claim 1, wherein said step of forming said first and second surface regions comprises scratching the first thin film.

14. A pattern forming method according to claim 1, wherein said first surface region is the modified portion of said first thin film or a surface of the object exposed by removing the portion of said first thin film.

15. A pattern forming method according to claim 1, wherein said second surface region is the modified portion of said first thin film or a surface of the object exposed by removing the portion of said first thin film.

16. A pattern forming method according to claim 1, wherein said step of forming said second thin film comprises vapor deposition of a material of the second thin film on the surface of said object.

17. A pattern forming method according to claim 1, wherein said step of forming said second thin film comprises coating the surface of said object with a liquid containing a material of the second thin film.

18. A pattern forming method according to claim 1, wherein said second thin film contains an organic compound.

19. A pattern forming method according to claim 1, wherein said step of forming said second thin film comprises supplying a material of the second thin film onto the surface of said object and heating the material of the second thin film supplied onto the surface of the object.

20. A pattern forming method according to claim 1, wherein said surface state is a surface energy.

21. A method of manufacturing a device having a fine pattern, comprising the steps of:

forming a first thin film on an object to be etched;

forming a first surface region and a second surface region on a surface of the object by modifying or removing a portion of said first thin film, said first and second surface regions differing from each other in a surface state;

forming a second thin film selectively on said first surface region by utilizing the difference in the surface state between the first and second surface regions, said second thin film being amorphous and thicker than the first thin film; and etching the object using the second thin film as an etching mask, the etched object forming a fine pattern and constituting at least a part of the device, wherein said step of forming said second thin film comprises supplying a mask material onto said first and second surface regions to form said second thin film, said mask material agglomerating selectively on said first surface region by the difference in the surface state between the first and second surface regions.

22. A method of manufacturing a device according to claim 21, wherein said device is a semiconductor device or a recording medium.

23. A method of manufacturing a device according to claim 21, wherein said surface state is a surface energy.

24. A pattern forming method comprising the steps of:

forming a first thin film on an object to be etched;

forming a first surface region and a second surface region on a surface of the object by modifying or removing a portion of said first thin film, said first and second surface regions differing from each other in a surface state;

forming a second thin film selectively on said first surface region by utilizing the difference in the surface state between the first and second surface regions, said second thin film being amorphous and thicker than the first thin film; and etching the object using the second thin film as an etching mask, wherein said first thin film is a monoatomic film or a monomolecular film.

25. A pattern forming method comprising the steps of:

forming a first thin film on an object to be etched;

forming a first surface region and a second surface region on a surface of the object by modifying or removing a portion of said first thin film, said first and second surface regions differing from each other in a surface state;

forming a second thin film selectively on said first surface region by utilizing the difference in the surface state between the first and second surface regions, said second thin film being amorphous and thicker than the first thin film; and etching the object using the second thin film as an etching mask, wherein said object to be etched is a thin film formed on a substrate.

26. A pattern forming method comprising the steps of:

forming a first thin film on an object to be etched;

forming a first surface region and a second surface region on a surface of the object by modifying or removing a portion of said first thin film, said first and second surface regions differing from each other in a surface state;

forming a second thin film selectively on said first surface region by utilizing the difference in the surface state between the first and second surface regions, said second thin film being amorphous and thicker than the first thin film; and etching the object using the second thin film as an etching mask, wherein said step of forming said first and second surface regions comprises partially removing said first thin film and allowing a material differing from the material of the first thin film to be adsorbed on the surface of the object exposed by partially removing the first thin film.

27. A pattern forming method comprising the steps of:

forming a first thin film on an object to be etched;

forming a first surface region and a second surface region on a surface of the object by modifying or removing a portion of said first thin film, said first and second surfacc reuions differing from each other in a surface state;

forming a second thin film selectively on said first surface region by utilizing the difference in the surface state between the first and second surface regions, said second thin film being amorphous and thicker than the first thin film; and etching the object using the second thin film as an etching mask, wherein said step of forming said first and second surface regions comprises scratching the first thin film.

28. A pattern forming method comprising the steps of:

forming a first thin film on an object to be etched;

forming a first surface region and a second surface region on a surface of the object by modifying or removing a portion of said first thin film, said first and second surface regions differing from each other in a surface state;

forming a second thin film selectively on said first surface region by utilizing the difference in the surface state between the first and second surface regions, said second thin film being amorphous and thicker than the first thin film; and etching the object using the second thin film as an etching mask, wherein said step of forming said second thin film comprises coating the surface of said object with a liquid containing a material of the second thin film.

29. A pattern forming method comprising the steps of:

forming a first thin film on an object to be etched;

forming a first surface region and a second surface region on a surface of the object by modifying or removing a portion of said first thin film, said first and second surface regions differing from each other in a surface state;

forming a second thin film selectively on said first surface region by utilizing the difference in the surface state between the first and second surface regions, said second thin film being amorphous and thicker than the first thin film; and etching the object using the second thin film as an etching mask, wherein said step of forming said second thin film comprises supplying a material of the second thin film onto the surface of said object and heating the material of the second thin film supplied onto the surface of the object.

* * * * *